United States Patent [19]

Bobeck

[11] 4,142,247
[45] Feb. 27, 1979

[54] CONDUCTOR-DRIVEN MAGNETIC BUBBLE MEMORY WITH AN EXPANDER-DETECTOR ARRANGEMENT

[75] Inventor: Andrew H. Bobeck, Chatham, N.J.

[73] Assignee: Bell Telephone Laboratories, Incorporated, Murray Hill, N.J.

[21] Appl. No.: 857,919

[22] Filed: Dec. 6, 1977

[51] Int. Cl.² ............................................. G11C 19/08
[52] U.S. Cl. ........................................ 365/8; 365/19; 365/36; 365/37
[58] Field of Search ................... 365/8, 19, 36, 37

[56] References Cited

U.S. PATENT DOCUMENTS

| | | | |
|---|---|---|---|
| 3,706,081 | 12/1972 | Bobeck et al. | 365/11 |
| 3,967,002 | 6/1976 | Almasi et al. | 365/36 |

*Primary Examiner*—James W. Moffitt
*Attorney, Agent, or Firm*—Herbert M. Shapiro

[57] ABSTRACT

A magnetic bubble memory with a single electrically-conducting layer for defining a bubble propagate arrangement is adapted to provide a compatible bubble expander detector by a sequence of increasingly larger apertures in the conducting layer.

6 Claims, 3 Drawing Figures

CONDUCTOR-DRIVEN MAGNETIC BUBBLE MEMORY WITH AN EXPANDER-DETECTOR ARRANGEMENT

FIELD OF THE INVENTION

This invention relates to magnetic bubble memories.

BACKGROUND OF THE INVENTION

Cross Reference to Related Applications

The present application is related to patent applications, Ser. Nos. 857,920, 857,921, 857,925, filed Dec. 6, 1977, for A. H. Bobeck.

Magnetic bubble memories are well known in the art. The most familiar mode of operating a magnetic bubble memory is termed the "field-access" mode. In this mode, a pattern of magnetically soft elements is formed in a plane adjacent a layer of material in which the bubbles are moved. A magnetic field is generated in the plane of bubble movement and caused to reorient to incrementally-offset radial positions (precess) cyclically in the plane. The pattern of elements is shaped so that various portions thereof respond to the in-plane field to generate pole patterns which move as the field precesses in a manner to cause bubble movement.

The most familiar pattern of elements includes T and bar shaped elements although many other element geometries such as asymmetric half discs also are being used presently. U.S. Pat. No. 3,534,347 of A. H. Bobeck, issued Oct. 13, 1970, discloses the basic field-access mode of operating magnetic bubble memories. The elements are formed from a layer of magnetically soft material such as permalloy. But, for example, ion-implanted regions, mesas and grooves in the bubble layer also operate in the field-access manner.

Because magnetic bubbles were becoming increasingly smaller and were being moved increasingly faster, as the art developed, detection of a bubble became the focus of attention fairly early in the development of the art. For the field-access mode of operating a bubble device, permalloy elements, operative in response to the reorienting in-plane field, were organized in groups to enlarge a bubble for detection. In this connection, increasing numbers of chevron-shaped elements were arranged in successive stages to elongate a bubble laterally with respect to the direction of bubble movement. The elements of the stage typically with the largest number of elements were interlinked by permalloy interlinking elements to form a magneto-resistance detector capable of detecting the presence and absence of a bubble during operation. U.S. Pat. No. 3,702,995 of A. H. Bobeck, F. J. Ciak, and W. Strauss, issued Nov. 14, 1972, discloses such an arrangement.

An alternative form of magnetic bubble memory employs electrical conductors for moving the bubbles. The conductors are formed in multiple layers, insulated from one another and driven in a three-phase manner. U.S. Pat. No. 3,460,116 of A. H. Bobeck, U. F. Gianola, R. C. Sherwood and W. Shockley, issued Aug. 5, 1969, discloses one such arrangement.

In such a "conductor-access" bubble memory, an elongated conductor loop is driven to cause enlargement of a bubble for detection. The bubble is usually detected, on collapse. R. F. Fischer, U.S. Pat. No. 3,564,518 issued Feb. 16, 1971, discloses such an arrangement.

A copending application of A. H. Bobeck, Ser. No. 857,921 filed on even date herewith, discloses a new and novel type of bubble memory with a conductor propagation arrangement where only a single electrically conducting implementation is employed. That is to say, the propagation arrangement for moving magnetic bubbles employs a single layer of electrically conducting material which includes an array of apertures and to which a single, multiphase pulse form is applied for effecting bubble movement.

A problem with such a conductor-access bubble memory is the detection of a bubble. There is no single electrical conductor loop present for expanding a bubble nor is there permalloy or an in-plane field for this purpose as is the case with field-access bubble memories.

BRIEF DESCRIPTION OF THE INVENTION

The solution to this problem is to provide a sequence of increasingly longer apertures in the electrically conducting layer to which the multiphase pulse form is applied for effecting bubble movement. In response to the propagate waveform, bubbles elongate laterally as they advance to a detector stage. A permalloy magneto-resistance detector couples the bubble layer at the position of the longest of the sequence of apertures in the conducting layer. A pair of rest possitions for a bubble is associated with each aperture and coextensive with the lateral dimension of that operative to insure bubble elongation as well as unidirectional movement.

DETAILED DESCRIPTION

Figure 1:
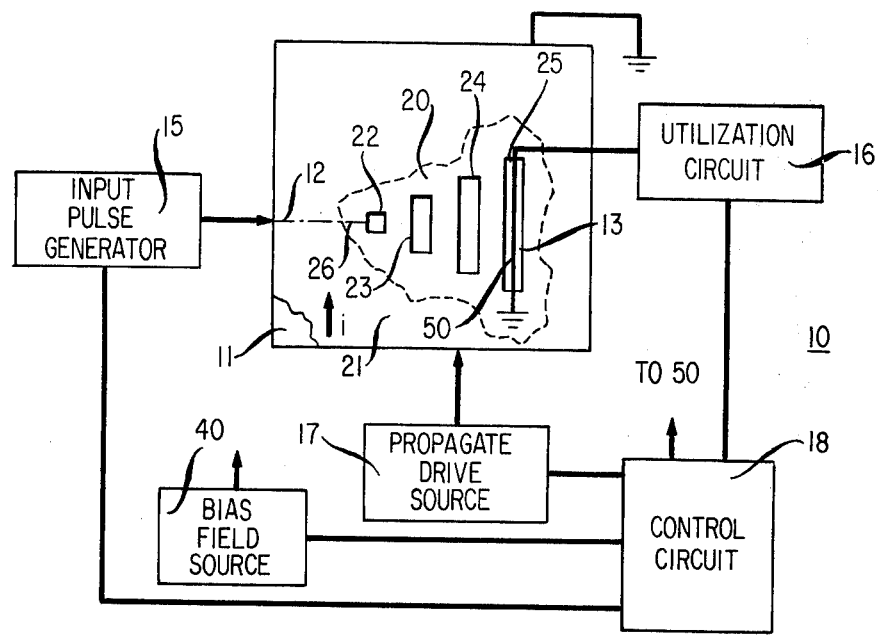
FIG. 1 is a schematic representation of a magnetic bubble memory including a conductor-driven, expansion detector arrangement in accordance with this invention.

FIG. 1 shows a magnetic bubble memory 10 including a layer 11 of magnetic material in which magnetic bubbles can be moved. Layer 11 typically comprises a film of magnetic garnet material grown epitaxially on a nonmagnetic substrate not shown. The bubbles are moved in layer 11 from an input position, designated 12, to a detector stage 13 by a propagation implementation operative responsive to propagate signals. Bubbles are generated at input position 12 in response to input pulses supplied by generator 15. Output signals at 13 are applied to a utilization circuit 16. Propagate signals are supplied by a propagate drive source represented by block 17.

Elements 15, 16 and 17 operate under the control of a control circuit represented by block 18. The various elements may be any such elements capable of operating in accordance with this invention. Y. S. Chen, J. E. Geusic, T. J. Nelson and H. M. Shapiro U.S. Pat. No. 3,789,375 issued Jan. 29, 1974, for examle, discloses one suitable magnetic bubble generator. A. H. Bobeck U.S. Pat. No. 3,810,132, issued May 7, 1974, discloses a reference field-access bubble expansion detector. The present invention is directed primarily at an alternative expansion detector which is of the conductor-access mode adapted for use with the conductor-access drive arrangement disclosed in the copending application noted hereinbefore.

Figure 2:
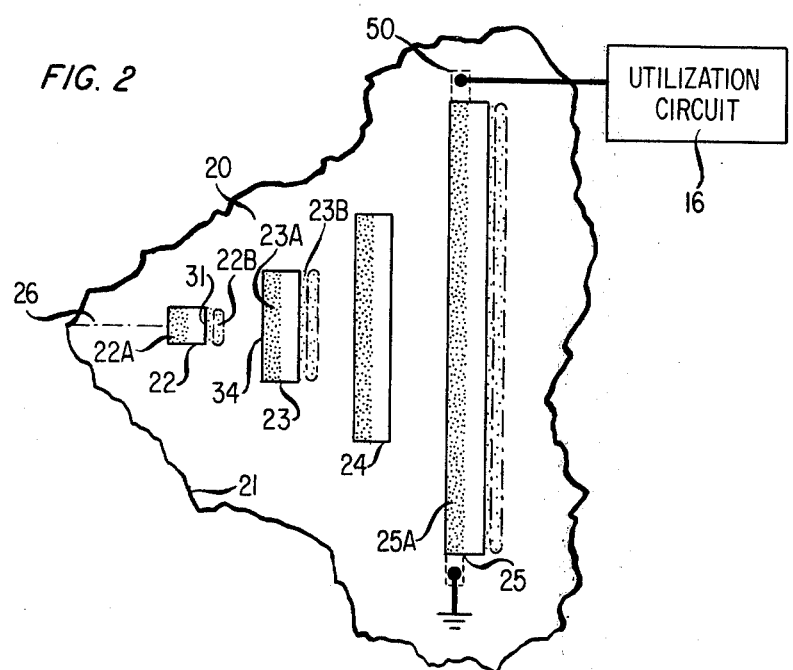
FIG. 2 is an enlarged, top view of a portion of the memory of FIG. 1 showing the expansion detector arrangement of FIG. 1; and, FIG. 3 is a pulse diagram of the propagate pulse sequence for movement of bubbles in the memory of FIG. 1.

FIG. 2 shows an enlarged view of a portion 20 of the propagation implementation of the memory of FIG. 1. Portion 20 is operative responsive to bubble propagate signals to enlarge bubbles laterally with respect to the path of bubble movement. Successive enlargement of a bubble commences as a bubble enters portion 20 and proceeds incrementally as a bubble advances stage after stage until a maximum occurs at what is termed the "detector" stage. A magneto-resistance detector is disposed at the detector stage and is operative responsive to an interrogate pulse applied thereto by control circuit 18, in synchronism with the propagate drive pulses, to apply to utilization circuit 16 signals indicative of the presence of an enlarged bubble then present in the detector stage.

At this juncture in the description, specific attention is directed at the structure of the expansion detector arrangement and mode of operation thereof to which bubble patterns in layer 11 respond to move and enlarge as described. FIG. 2 shows the portion of the bubble propagate circuit operative to enlarge bubbles. The circuit comprises a layer 21 of electrically conducting material of uniform thickness, typically 0.3 microns, overlying layer 11. Layer 21 is formed, illustratively, to include a pattern of apertures 22, 23, 24, 25. The apertures are arranged in succession along the path 26 of bubble propagation. It is to be noted that the apertures have increasingly larger long dimensions as viewed from left to right along path 26, the long dimensions being arranged laterally with respect to the path.

Each of the succession of apertures includes a first and second edge, A and B, along path 26. Thus, aperture 22 includes edges 22A and 22B and aperture 23 includes edges 23A and 23B, etc. Ion-implanted regions are formed in layer 11 in alignment with the A and B edges of the apertures and are shown stippled in FIG. 2. The implanted regions have dimensions lateral to path 26 (viz: the long dimension) coextensive with the lateral dimension of the aperture and commencing with the associated edge. The illustrative arrangement thus includes two ion-implanted regions for each aperture. The ion-implanted regions are formed to a depth of 0.3 microns and are operative to increase the free bubble collapse field. Thus the regions define low energy positions for bubble to rest between drive pulses.

Figure 3:
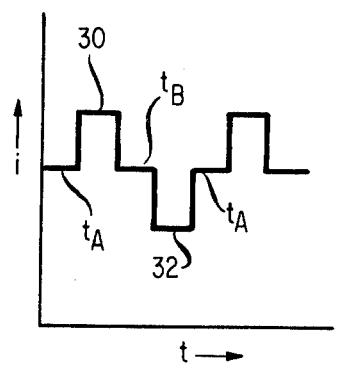

FIG. 3 shows a propagate pulse waveform for the movement of bubbles in layer 11. Source 17 applies such a waveform to conductor layer 21 from the bottom to the top as viewed in FIG. 1. Layer 21 is shown connected to ground at the top in the FIG. Current flows in layer 21 as indicated by arrow i in FIG. 1 in response to a positive pulse such as 30 in FIG. 3. We will adapt the convention that a bubble in layer 11 has its magnetization directed upwards toward the viewer in FIG. 1 and that a bubble moves to the left edge of the portions of layer 21 between the apertures when a positive pulse is applied to layer 21.

Consider a bubble positioned initially at the ion-implanted region at edge 22A at time $T_A$ in FIG. 2. A current pulse 30 applied to layer 21 moves the bubble to edge 22B of FIG. 2. At the termination of pulse 30, the bubble moves into the ion-implanted region at edge 22B at time $T_B$ in FIG. 3. A negative-going pulse 32 is next applied to layer 21. The bubble, in response, moves to the left edge 23A of aperture 23. At the termination of pulse 32, the bubble moves into the ion-implanted region at edge 23A. One cycle of operation is now complete.

A glance at FIG. 2 reveals a succession of ion-implanted regions interleaved with nonimplanted regions. A succession of spaced and alternatively-poled current pulses moves the bubbles out of the nonimplanted regions and the zero current levels between oppositely poled pulses allow the bubbles to move into the next consecutive ion-implanted regions. The succession of regions establishes a periodicity which constrains bubbles into patterns where only 'A' positions or 'B' positions can be occupied between current pulses. Thus, a bubble pattern for the data 1101 is shown in FIG. 2, the bubbles occupying the 'B' positions. Note that no bubble is associated with aperture 24 indicating a binary zero at that position in the data stream.

It is now clear that the structure of FIGS. 1 and 2 is operative to move bubbles in response to the waveform of FIG. 3. It is to be understood that the structure as shown also is operative to enlarge bubbles laterally with respect to path 26 as the bubbles move to the right as viewed in FIG. 2. The enlargement of bubbles is due to the increasingly longer lateral dimension of the apertures in FIG. 2. In each instance when a current pulse 32 is applied to layer 21, a bubble experiences an attractive field over an increasingly longer lateral dimension in its movement from a 'B' to an 'A' position. The bubble, in response, not only moves to the right, as viewed, but enlarges laterally to become coextensive with the lateral dimension of the propagate field generated by pulse 32. By providing an increasingly larger long dimension, successive lateral enlargement of the bubbles result. Of course, only four stages are shown for illustrative purposes. It should be clear that in practice a greater number of stages is used. Further, regions are shown as being the same width along path 26 in the illustrative embodiment. But this is not necessarily the case.

In one specific embodiment, a layer of aluminum-copper, 0.3 microns thick, was electroplated onto the surface of calcium-germanium garnet in which magnetic bubbles could be moved. A succession of apertures 4 microns wide on 8 micron spacings was formed by photo-etching techniques. The apertures had long dimensions of 4 microns with each aperture being 8 microns greater than the next preceding aperture. A succession of 3 apertures caused a bubble, having a nominal diameter of 1.7 microns, to grow to a lateral dimension of 40 microns. In this specific embodiment, layer 21 has a thickness of 0.3 microns and an impedance of 0.1 ohms/square. Current pulses 30 and 32 had amplitudes of 150 milliamperes and durations of 0.5 microseconds with no spacings. Operation of 1 megahertz was achieved. The bias field was 240 oersteds and was supplied by a familiar source represented by block 40 in FIG. 1. The ion-implanted regions had widths of 2 microns and depths of 0.3 microns, and were formed by exposure at 100 KEV to a beam of Neon for providing an implant of $5.0 \times 10^{13}$ atoms/cm$^2$.

The enlarged bubble is detected illustratively when it advances to the position of ion implanted region 25A. For detection, a thin layer 50 of permalloy is deposited over region 25A and is connected between utilization circuit 16 and ground. Layer 50 forms a magneto-resistive detector and is responsive to an interrogate signal from control circuit 18 to apply to circuit 16 an indication of the presence or absence of a bubble in layer 11 at region 25A, during time $T_A$ during each cycle of operation. Illustratively, layer 50 has a thickness of 400 Angstrom units and extends beyond region 25A to overlie layer 21. Signals of 0.5 millivolts are achieved.

The shapes of the apertures and ion-implanted regions are not necessarily rectangular as shown. Nor are the rest regions necessarily defined by ion implanting. Depressions in the bubble layer itself or permalloy elements overlying layer 21 and touching layer 11 in the apertures also may be used to this end. A propagation arrangement for bubbles using such out-of-plane permalloy elements is disclosed in copending application Ser. No. 857,920 filed on even date herewith for A. H. Bobeck. All that is necessary is that a single electrically-conducting film be apertured to provide electrically conducting segments which have incrementally increasing lateral dimensions operative to expand a bubble laterally as it is moved and that rest positions be provided with lateral dimensions to sustain the enlarged bubble in each instance.

Moreover, the zero current levels sustained between drive pulses 30 and 32 may be vanishingly small. The duration of these zero levels depends on the mobility of the bubble layer as well as the positions of the ion-implanted areas. On the other hand, it is contemplated that zero levels may last an indefinite number of microseconds. In either case, speeds of 10 megahertz may be achieved with the present structure.

What has been described is considered merely illustrative of the principles of this invention. Clearly, those skilled in the art are capable of devising various modifications of this invention in accordance with those principles within the spirit and scope of the invention as claimed hereinafter.

What is claimed is:

1. A magnetic bubble memory comprising a layer of magnetic material in which magnetic bubbles can be moved, said layers having a first surface, an electrically conducting film adjacent said first surface, said film having a pattern of apertures defined therein along a path between input and output positions, said apertures defining a succession of edges along said path, drive means for applying to said film a current waveform operative to move bubbles to successive ones of said edges along said path, means for defining a succession of rest positions in said layer offset from successive ones of said edges, said film including at least one portion thereof wherein successive ones of said apertures and associated rest positions have increasingly larger long dimension laterally oriented with respect to said path for causing incremental increases in the lateral dimensions of bubbles being moved therealong in response to said waveform.

2. A magnetic bubble memory in accordance with claim 1 wherein said means for defining a succession of rest positions includes a succession of ion-implanted regions in said layer, each of said regions having an edge aligned with an edge of an associated one of said apertures.

3. A magnetic bubble memory in accordance with claim 2 wherein said drive means is adapted to provide a current flow transverse to said path.

4. A magnetic bubble memory in accordance with claim 3 in which said portion of said pattern and said ion-implanted regions are rectangular in geometry having increasingly larger long dimension reaching a maximum long dimension at a detector stage.

5. A magnetic bubble memory in accordance with claim 4 also including a thin film of permalloy oriented transverse to said path at said detector stage for applying to a utilization circuit a signal indicative of the presence or absence of a bubble in response to an interrogate signal.

6. A magnetic bubble memory comprising a layer of magnetic material in which magnetic bubbles can be moved, and electrically-conducting means operative to move bubbles to successive first positions in said layer along a path of bubble propagation, and means for defining rest positions for bubbles offset from said first positions, said electrically conducting means comprising an electrically conducting film including a set of apertures therein for defining said path, wherein successive ones of said apertures and associated ones of said rest positions have increasingly longer dimensions lateral to the axis of said path.

* * * * *